Figure 1:
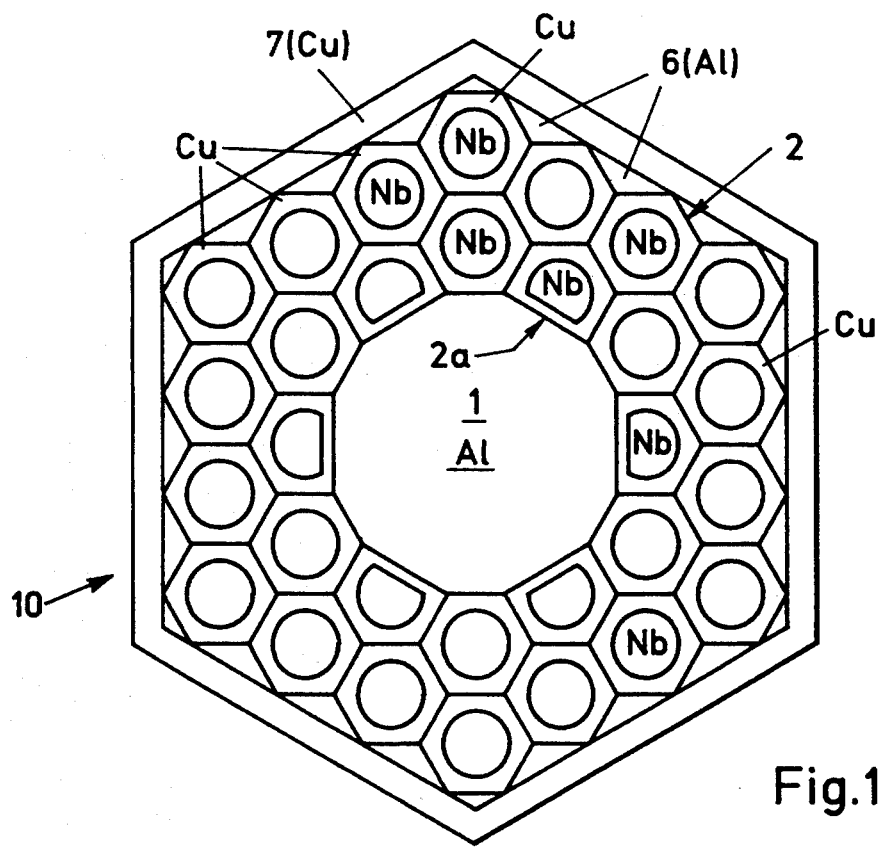

United States Patent [19]
Walters et al.

[11] Patent Number: 5,419,974
[45] Date of Patent: May 30, 1995

[54] COMPONENT AND METHOD FOR FABRICATING SUPERCONDUCTING WIRE

[75] Inventors: Colin R. Walters, Abingdon; Jan E. Evetts, Cambridge; Francis J. V. Farmer, Sutton Coldfield; Thomas J. Hawksley, Bromyard, all of United Kingdom

[73] Assignee: British Technology Group Ltd., London, United Kingdom

[21] Appl. No.: 20,309

[22] PCT Filed: Jul. 5, 1991

[86] PCT No.: PCT/GB91/01098
§ 371 Date: Jan. 11, 1995
§ 102(e) Date: Jan. 11, 1995

[87] PCT Pub. No.: WO92/01317
PCT Pub. Date: Jan. 23, 1992

[30] Foreign Application Priority Data

Jul. 6, 1990 [GB] United Kingdom ............... 9014966

[51] Int. Cl.$^6$ ............................................. B32B 9/00
[52] U.S. Cl. ........................... 428/688; 428/930; 428/614; 174/125.1; 29/599; 505/821; 505/806
[58] Field of Search ............... 428/694, 545, 930, 577, 428/615, 614, 616, 617; 505/821, 806, 856, 884; 29/29, 599, DIG. 11, DIG. 14; 148/98, 95, 96; 174/125.1

[56] References Cited

U.S. PATENT DOCUMENTS

| | | | |
|---|---|---|---|
| 3,905,839 | 9/1975 | Hashimoto | 428/930 |
| 3,925,882 | 12/1975 | Sambrook | 428/930 |
| 3,926,684 | 12/1975 | Howe | 428/930 |
| 3,963,425 | 6/1976 | Sambrook | 428/930 |
| 4,409,297 | 10/1983 | Howe | 428/930 |
| 4,723,355 | 2/1988 | Both et al. | 29/599 |
| 5,100,481 | 3/1992 | Nakayama et al. | 428/930 |

FOREIGN PATENT DOCUMENTS 0156626 10/1985 European Pat. Off.
0230567 8/1987 European Pat. Off.
2201830 9/1990 United Kingdom.

OTHER PUBLICATIONS

Wilson, "Superconducting Magnets," 1987, Chapter 12.
IEEE Trabsactions On Magnetics, vol. 25, No. 2, Mar. 1989, pp. 1484–1487, IEEE New York, US: & Applied Superconductivity Conference, 21st-25th Aug. 1988, San Franciso, US; H. Tsuji et al p. 1484, Fig. 1.
Proceedings of the 7th. Symposium on Engineering Problems in Fusion research, 25th. Oct. 1977, Knoxville, Tenn., pp. 1278–1281, IEEE New York, US W. A. Fietz et al, "Conductors . . . ") p. 1280, right-hand colum; pp. 1281, FIG. 7*.
Takahashi et al, "Developement of 12 T-10 kA AL-Stabilized Nb3Sn Conductor for TMC-II" IEEE Transaction on Magnetics, pp. 157–160.
Eric Gregory, "Conventional Wire and Cable Technology", Proceeding of the IEEE, Aug. 1989, No. 8 pp. 1110–1123.

Primary Examiner—Patrick J. Ryan
Assistant Examiner—Patrick Jewik
Attorney, Agent, or Firm—Cushman, Darby & Cushman

[57] ABSTRACT

A component 10 for making Al5 Nb3Sn superconducting wire is of plane-filling cross-section after removing temporary additions 6, 7. It consists of a central pillar 1 of aluminium (later replaced by tin) surrounded by a two-deep array of polygonal copper columns 2/2a containing niobium rods. Many (e.g. 61) components 10 are stacked together and extruded. The niobium rods adopt and retain a uniform distribution with minimum intervening material. On heat-treatment of the whole, the tin diffuses over a relatively short path and hence consistently into the rods, whereby there is formed a kilofilament Nb3Sn wire.

7 Claims, 4 Drawing Sheets

COMPONENT AND METHOD FOR FABRICATING SUPERCONDUCTING WIRE

This invention relates to a component for use in fabricating superconducting wire and to a method of fabricating it, as well as to an intermediate member and to the product.

The theoretical potential of A15 superconductors such as $Nb_3Sn$ has been known since 1960, but due mainly to their brittleness, in thirty years no ideal way of mass-producing them into wires has been found. Contributing to the difficulty is the requirement for the wires to include a continuous phase of pure copper, to act as a normal electrical conductor, heat sink and mechanical support in case the $Nb_3Sn$ is accidentally warmed above its superconducting range.

The superconducting component should not be thick normal to the current-carrying direction, i.e. It should be merely a filament, otherwise magnetic fields will set up wasteful eddy currents in the component. At the same time, a mere filament would be able to carry only a small current, and therefore a superconducting wire conventionally consists of many parallel non-touching filaments of superconductor embedded in a matrix which is conveniently an ohmic conductor such as bronze or copper. Most conventional ways of mass-producing a superconducting wire rely on forming some precursor of the superconductor to the final required shape, then converting the precursor. For example, in the so called bronze route, rods of pure niobium are drawn down in a tin bronze to the extent that a fine wire is produced with filaments of niobium embedded in it. This precursor is then heated such that the niobium filaments are largely converted to niobium tin by reaction with the tin in the bronze. The main disadvantage of this route is that if there is more than 13% tin in the bronze it becomes progressively brittle during drawing until it finally breaks. This means that the mean current density in the final conductor is much reduced by the large volume of bronze required.

The so called internal tin route attempts to avoid the requirement for this large volume of bronze by including the tin separately in the precursor in the form of rods which are usually more than two orders of magnitude larger than the niobium filaments. There can be problems with drawing down even such precursors (the tin melts) and, as disclosed in UK Patent Application GB 2201830A, this can be partly mitigated by using aluminium in place of tin; at a later stage in the method, when the cross-section of the composite has been substantially reduced by drawing down or extrusion, the aluminium is removed from the composite and replaced with tin.

The composite (conventionally of circular cross-section) is extruded or drawn down, then an array of extruded composites is bundled together and further extruded, and so on, with as many of these stages as necessary. To avoid rupture of niobium filaments during the first extrusion, a relatively stout outer layer of copper is often left around the filaments. It will be seen that this leads to opposing design considerations. At each of these stages of bundling, these stout layers of copper or subsequent copper extrusion cans become part of the volume of the final conductor. Since copper competes with niobium for tin, this wastefully increases the amount of tin which must be provided and also increases the volume proportion of non-superconducting material. To minimise this effect, the number of extrusion/bundling stages can be reduced. This entails cramming many niobium filaments into each single starting composite while, for reasons of manufacturing practicability, the tin remains present in one rather thick rod per composite. On heat treatment to react the niobium filaments with the tin, exchange of copper and tin between the regions thereof occurs via relatively long tortuous diffusion paths through the stack of filaments and predisposes towards the formation of Kirkendahl voids caused by the different rates of diffusion of copper and tin. This is self-evidently a waste of potential current-carrying volume. Any design is a compromise between these effects.

The earlier-mentioned pure copper which is required is provided by enclosing arrays of composites inside barrier material such as tantalum, of thickness adequate to retain its integrity through extrusion, and encasing the whole in pure copper.

According to the present invention, there is provided a cylindrical component for use in fabricating superconducting wire, comprising a central pillar of a stanniferous, galliferous and/or germaniferous material or of an extrudable removable precursor thereof, or of aluminiferous material, preferably tin, surrounded by a two-deep array of cupriferous columns each containing a niobiferous rod, at least the outer set of said columns being polygonal, and the cross-section of the component being a plane-filling shape, whether before or after extrusion. By "cylindrical" it is clear we mean the word in its topological sense, not the layman's sense of "right-circular cylinder", since the cylindrical component according to the invention has a polygonal exterior. An advantage of the two-deep array is the shortening of the gallium/germanium/tin diffusion pathway from the central pillar to its most distant rod compared with GB 2201830 A, thus yielding a more uniform tin concentration in the product. The niobiferous metal may contain for example titanium and/or tantalum additives, which increase the upper critical field of Nb—Sn, e.g. Ti and/or Ta in quantities of up to 10% by weight.

In the two-deep array, there may be twelve cupriferous columns in the inner set and eighteen cupriferous columns in the outer set, the latter eighteen preferably being regular-hexagonal in cross-section, and at least some of the inner set preferably being identical. Alternate cupriferous columns of the inner set may be pentagonal in cross-section.

The central pillar is preferably duodecagonal in cross-section.

Such a geometry can more closely approach the optimum proportions of tin (in the central pillar) to niobium with minimum copper while offering shorter average diffusion paths for the tin than heretofore.

As the cross-section of the component is a plane-filling shape, i.e., repeated indefinitely in the same size, an unlimited number of the components can be close-packed to fill a plane without voids. (Regular hexagons and squares are examples of plane-filling shapes, but a plane-filling component according to the invention would normally be more complex in shape.)

The component is preferably further surrounded by removable filler strips of an extrudable metal or alloy with a higher melting point than any one of tin, germanium or gallium, so profiled as to impart to said component a void-free extrudable cross-section, such as regular hexagon or a circle. Since presses capable of (the theoretically more ideal) hexagonal-to-hexagonal hydrostatic extrusion number well under 1/continent, it is alternatively possible to make the component temporarily right-circular-cylindrical (using the removable filler strips) to widen the choice of extrusion sub-contractors, the filler strips and any surrounding extrusion can being removed after the extrusion.

The invention extends to an intermediate member comprising a close-packed array of the components set forth above (any of said removable filler strips having been removed). Because the said components are not surrounded by the previously necessary stout outer layer of copper, not only is tin saved and the volume more efficiently used for carrying current, but the spacing of the said columns in the intermediate member is substantially constant even across the join between adjacent components, thus assisting uniformity of properties after heat-treatment (described later), reducing the risk of Kirkendahl voids and reducing the risk that when the niobium rods are expanded by absorbing tin, neighbouring superconductor rods from neighbouring arrays will come into contact, permitting wasteful eddy currents laterally to the length of the rods.

The invention further extends to a method of fabricating a superconducting wire, comprising applying external filler strips to the said intermediate member, these strips being so profiled as to impart to the member a substantially void-free extrudable cross-section, which itself is preferably plane-filling, such as a regular hexagon, and may be surrounded by a diffusion barrier such as tantalum foil, optionally with an exterior niobium layer. The member (preferably then encased in an extrusion can) may then be worked (e.g. extruded or drawn) into the shape of a wire.

At some stage in the above, the central pillars may be removed (e.g. melted or dissolved out, for example if of aluminium, dissolved out by hot sodium hydroxide) and replaced by stanniferous metal, or aluminium may be left. Then the member may be heat-treated to diffuse the tin or aluminium via the columns into the rods to form the $Nb_3Sn$ or $Nb_3Al$ superconductor.

The invention therefore extends to a superconducting wire made as set forth above, and to one which has at least one, preferably at least two, such as at least three gallium/germanium cores per hundred superconducting filaments, preferably with under 0.1% void volume, and preferably with a ratio of (actual filament diameter):(effective filament diameter) of at least $\frac{1}{2}$, such as at least $\frac{3}{4}$, such as at least 0.9.

Figure 1A:
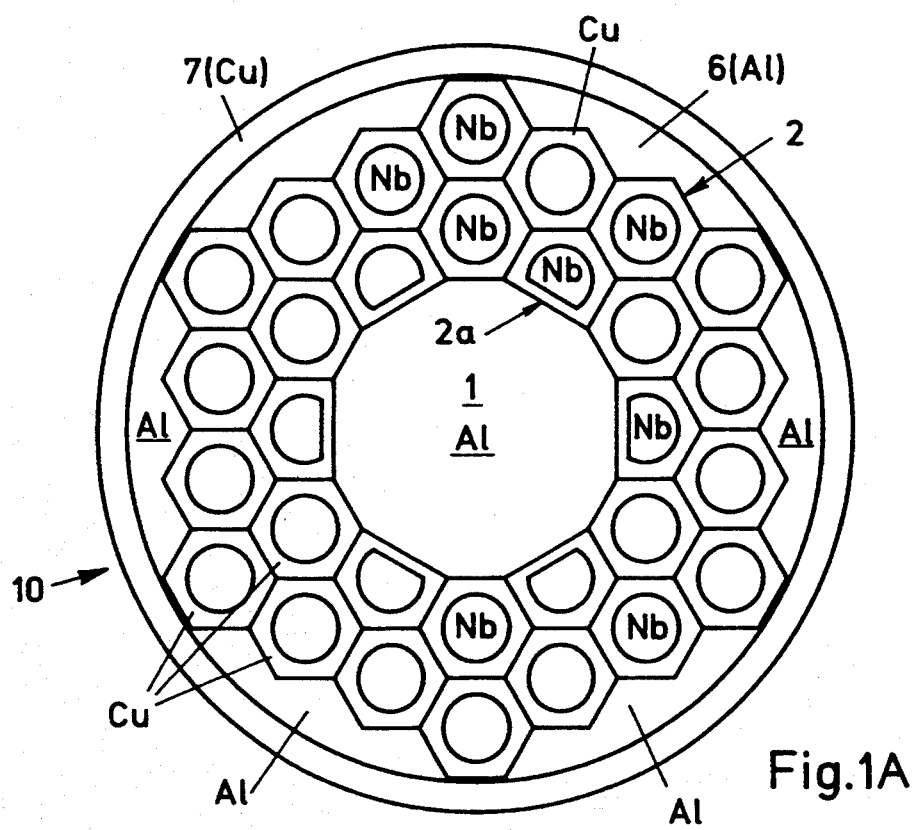
Figure 2:
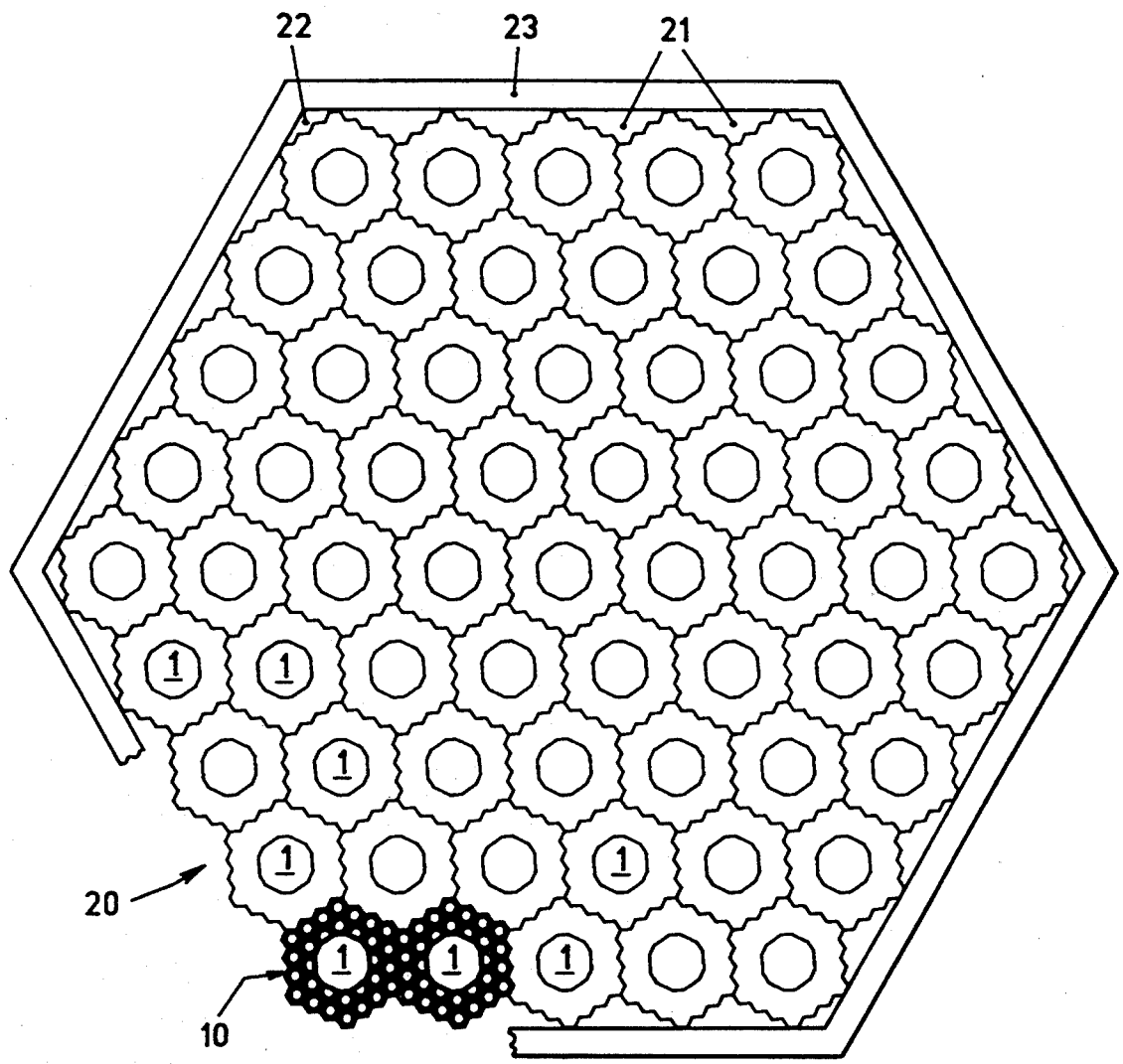
Figure 3:
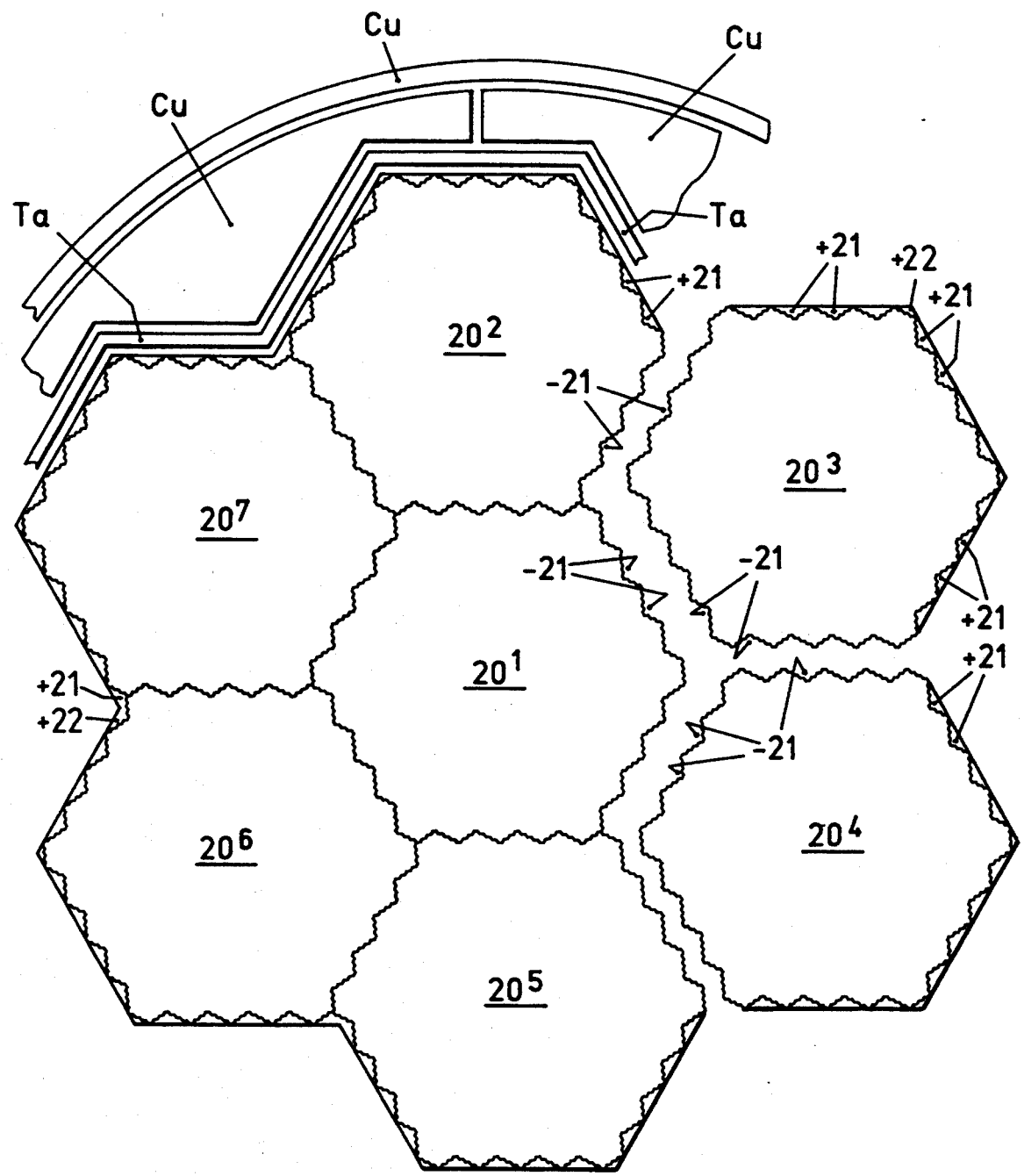
Figure 4:
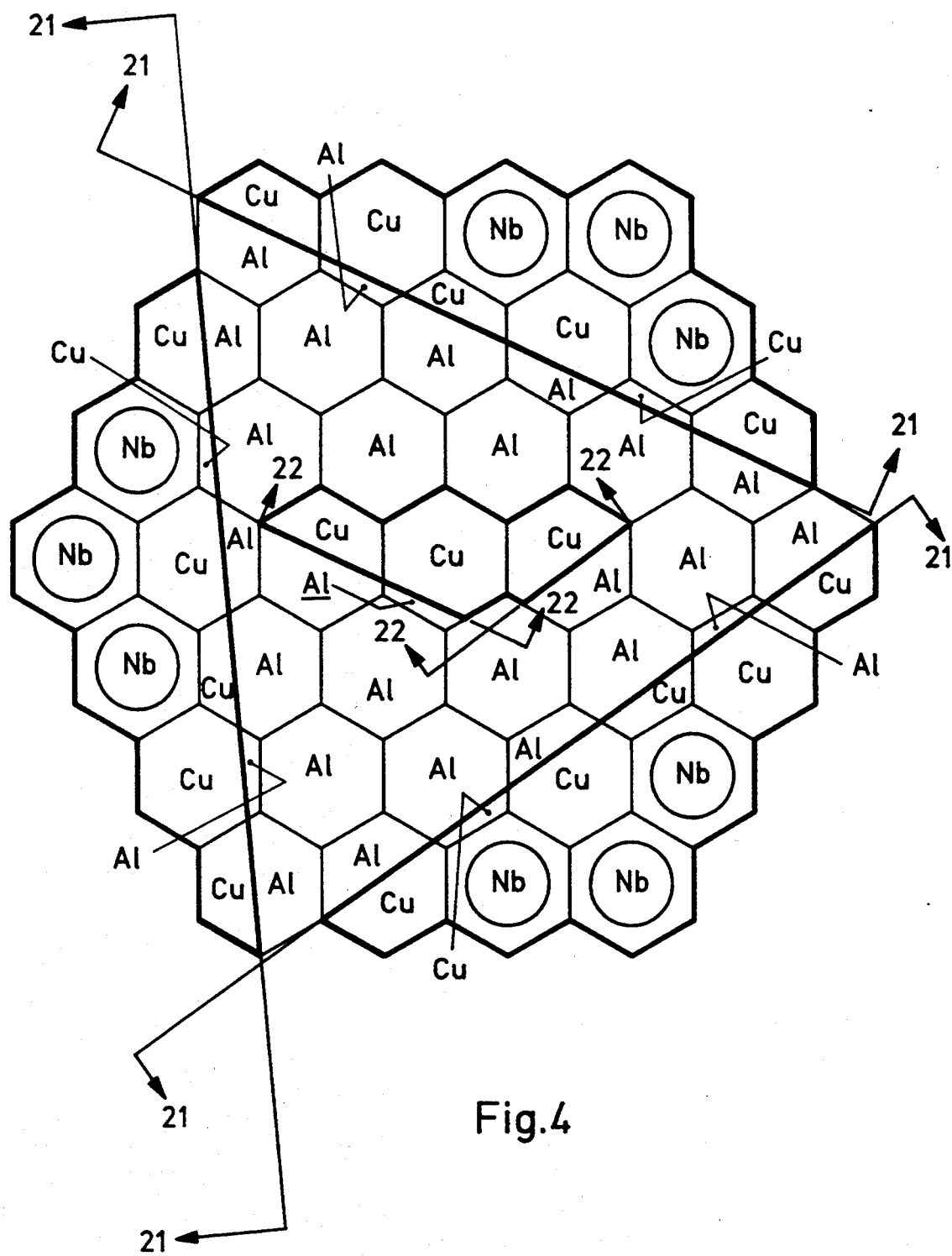

The invention will now be described by way of example with reference to the accompanying drawings, in which FIG. 1 is a cross-section of a cylindrical component according to the invention, roughly full-size, FIG. 1A is a cross-section of an alternative design to FIG. 1, FIG. 2 is a cross-section of an intermediate member according to the invention, also roughly full-size, FIG. 3 is a cross-section of an assembly of several of the FIG. 2 intermediate members, and FIG. 4 is a cross-section of a special intermediate, shown enlarged about tenfold (linear magnification), used in the preparation of external filler strips for the intermediate member.

Turning to FIGS. 1 and 1A (which are alternatives), a cylindrical component 10 comprises a central duodecagonal pillar 1 of aluminium surrounded by a two-deep array of polygonal copper columns 2 each containing a cylinder of niobium. Of the thirty columns 2, twentyfour will be seen to be regular hexagons, the rest 2a being of a specific pentagonal shape (nearly as easy to make both as regards copper and niobium) to fill the shape. (It could be envisaged for the six 2a and the six others on the inner ring to have an arcuate inner edge, to encircle a circular cross-sectional pillar 1. Other variations are also possible. However, the layout in the Figures represents an optimal volume ratio of aluminium to niobium.) Temporarily, the component 10 is surrounded by aluminium filler strips 6 encased in a strippable copper protective sheath 7, the whole being substantially void-free and readily extrudable. The whole is preheated to 200° C. to promote bonding of the structure.

The whole is extruded to one-thirtieth of the starting cross-sectional area, maintaining the hexagonal (FIG. 1) or circular (FIG. 1A) cross-section, whereby internal compression is isotropic and the shape (despite the thirtyfold reduction) is not disturbed at all. Much work is done, and hence heat is generated, during this operation, and the temperature rises to a level which would have melted tin but does not melt the aluminium. The heat usefully bonds the copper columns 2 together.

The copper sheath 7 is stripped off and the aluminium filler strips 6 are removed by dissolution in caustic soda. The (reduced) component 10 is assembled in close-packed (void-free) array with sixty more in a generally hexagonal array to form an Intermediate Member, indicated as "20" in FIG. 2.

There are now several choices of route to the desired superconductor wire. Five examples will be described.

ROUTE 1

For this route, it may be convenient to go directly to a larger hexagonal array of components 10, the next larger size containing ninety-one of them, and the next size again containing 127.

The Intermediate Member (the array of sixty-one (or 91 or 127) components 10) is then surrounded (in the "sixty-one" version as shown in FIG. 2) by twentyfour filler strips 21 and six corner filler strips 22 to present a regular hexagonal exterior. This is wrapped in tantalum foil 23, which acts as a tin diffusion barrier. In this and the alternative Routes, the Intermediate Member wrapped in tantalum foil 23 may then be wrapped in niobium foil, not shown. (The filler strips 21 and 22 are described in more detail later.)

Let this be Stage A. Then arcuate filler strips of copper are applied around the tantalum foil 23 (or of course the niobium foil if present), the copper strips being so profiled as voidlessly to encase the foil 23 in a right-circular cylinder. This is inserted into a copper extrusion can, the copper being a necessary part of the final product as explained above, and the whole drawn to the final wire size. Let this be Stage B.

ROUTE 2

The Intermediate Member (the array of sixty-one components 10), item 20 of FIG. 2, is surrounded by twenty-four filler strips 21 and six corner filler strips 22 to present a regular hexagonal exterior. This is wrapped in tantalum foil 23, which acts as a tin diffusion barrier. (The filler strips 21 and 22 are described in more detail later.) A thicker tantalum can may be expedient in some cases, instead. Let this be Stage A. This is extruded down to one-tenth of its starting area. Let that be Stage B. The tantalum-clad extrusion-reduced Intermediate Member is inserted into a close-fitting hexagonal copper tube, and seven (or nineteen, thirty-seven, sixty-one . . . ) of the tubes are assembled into a close-packed hexagonal array. Aluminium arcuate filler strips are applied to the outside of this array, so profiled as voidlessly to encase the array in a hexagon or right-circular cylinder as convenient; this is inserted into a copper extrusion can and extruded and/or drawn to the final wire size. The copper can may then be removed (by dissolution in nitric acid), and then the aluminium (by dissolution in caustic soda).

ROUTE 3

This is identical to Route 2 except for a modification in case there is no access to a hexagonal-to-hexagonal extrusion press as is necessary immediately after Stage A. In Route 3, Stage A is followed by applying arcuate aluminium filler strips to the outside of this array, so profiled as voidlessly to encase it in a right circular cylinder, which is canned in copper. This is subjected to circular→circular extrusion to one-tenth of its starting area. The copper is then removed by dissolution in nitric acid, followed by the aluminium (dissolved in caustic soda). This is Stage B, and Route 2 is rejoined at that point.

ROUTE 4

The Intermediate Member (the array of sixty-one components 10), item 20 of FIG. 2, is surrounded by twenty-four filler strips 21 and six corner filler strips 22 to present a regular hexagonal exterior. This is wrapped in aluminium foil and then inserted into a hexagonal copper extrusion can, the aluminium serving as a copper-copper antibonding layer. This is Stage A. The whole is extruded to one-tenth of its starting area. This is Stage B. The copper can is dissolved away by dissolution in nitric acid and the aluminium foil is dissolved away by dissolution in caustic soda. The resultant reduced Intermediate Member has a space-filling cross section, and seven (or 19 or 37 . . . ) of them are voidlessly stacked in hexagonal array. That array is wrapped in tantalum foil (to act as a tin diffusion barrier) and arcuate copper fillers are applied round it, so profiled as voidlessly to encase the foil in a right-circular cylinder. This is inserted into a copper extrusion can, the copper being a necessary part of the final product as explained above, and the whole drawn to the final wire size.

ROUTE 5

The intention is to assemble seven Intermediate Members 20 in hexagonal array, as shown in FIG. 3, to form the final superconducting wire. These Members are notionally labelled $20^1$, $20^2$ . . . $20^7$, according to their intended individual positions in the hexagonal array. Member $20^1$ is made into a regular hexagon by adding filler strips $-21$ and $-22$ as explained in FIG. 4 later. It is wrapped in aluminium foil (to serve as a copper-copper antibonding layer) and inserted into a hexagonal copper extrusion can. Members $20^2$–$20^7$, which are in fact identical, are each made into a regular hexagon by adding the filler strips $-21$ and $-22$ to three adjacent sides (those which will abut other Members 20) and adding strips $+21$ and $+22$ to the remaining (open) three sides. The strips $-21$ and $-22$ have the same shape as their counterparts $+21$ and $+22$ but are of aluminium. ($+21$ and $+22$ are identical to 21 and 22 of FIG. 4.) Then the Members $20^2$–$20^7$ are each wrapped in aluminium foil and inserted into a hexagonal copper extrusion can. This is Stage A. Then all seven Members are separately extruded to one-tenth of their area. That is Stage B. The copper extrusion can is dissolved away using nitric acid, and the aluminium (foil, and strips $-21$ and $-22$) is dissolved away using caustic soda. The seven Members $20^1$–$20^7$ can now be voidlessly stacked as originally envisaged in FIG. 3. It will be observed that they cannot in fact be assembled in any other than the correct orientations. That stack is is wrapped in tantalum foil (to act as a tin diffusion barrier) and arcuate copper fillers are applied round it, so profiled as voidlessly to encase the foil in a right-circular cylinder. This is inserted into a copper extrusion can, the copper being a necessary part of the final product as explained above, and the whole drawn to the final wire size. That final drawing, if started at 77K, allows quite a respectable reduction, such as to 1/10 of area, without exceeding an output temperature of 200 C. In that way, the tin (explained in a moment) is not melted.

At either Stage A or B of any Route, the aluminium pillars 1 are dissolved out using hot sodium hydroxide. Stage A is preferable because that dissolution is easier but Stage B is also preferable because the A→B extrusion is easier with aluminium in the pillars 1 than with its replacement. The aluminium is replaced by solid tin rods or by molten tin, which is caused to flow into the pillars 1.

The product of each Route may be bench-drawn then taken through wire dies as required, and the wire made into a winding as necessary for an electrical machine. By this time the individual columns 2 are under ten microns across. The product is lightly twisted in use (e.g. 1 turn per cm) in order to decouple the filaments electrically.

Then (or at any time after the tin was introduced if there was to be no subsequent strain greater than about 0.2% within the wire) the wire is heat-treated. The tin in the pillars 1 diffuses through the copper to the niobium (at no point having any great distance to go), forming in situ $Nb_3Sn$ (A15) superconductive kilofilament (but non-touching) wires.

Turning to FIG. 4, a special intermediate is shown enlarged for clarity, made up of hexagonal and part-hexagonal columns, which are identical to the columns 2 of FIG. 1, and some of which are further identical in that they contain niobium rods. The composition of each column is shown. Despite the apparent complexity of the part-hexagonal columns, only three different pairs of part-hexagonal dies are needed altogether. The special intermediate is geometrically the same as the component 10 of FIG. 1 and is extruded in the same way.

Then it is disassembled by etching in hot caustic soda (which removes the aluminium) to yield the filler strips 21 and 22 (as labelled), which were mentioned above.

These filler strips serve to preserve the overall optimum composition and, by filling the space, allow the subsequent extrusions to be performed with no distortion of the niobium rods, thereby at the same time allowing a full use of the volume for conductors (not wasting it with voids or excess inert material) and minimising the incidence of adjacent niobium rods touching, which would allow wasteful eddy currents lateral to the rod; in other words our actual rod diameter should closely approximate to the "effective diameter", which in the prior art is wastefully large because of touching rods.

The products of Route 2 or 3 show a network of 'veins' of tantalum and pure copper throughout their thickness. Although this is a loss of potential superconducting volume, it improves the safety margin if there is localised heating to above the superconducting temperature, by providing a nearby 'relief pathway' for accepting current and removing excess heat. The products of Route 1, 4 or 5, on the other hand, have tantalum and pure copper on the outside only, such that—the total amount of copper being held the same—the volume proportion of tantalum is less for a given barrier thickness. This improves the current-carrying capacity per unit cross-sectional area of the wire but reduces the electrothermal stability of the wire.

We claim:

1. A cylindrical component for use in fabricating superconducting wire, comprising a central pillar made of at least one material selected from the group consisting of a stanniferous, galliferous, germaniferous material, an extrudable removable precursor of the germaniferous material, and aluminiferous material, surrounded by a two-layered array of cupriferous columns, each containing a niobiferous rod, with an outermost layer of said columns being polygonal, a cross-section of the component being a plane-filling shape;

wherein the cylindrical component is structured so as to allow stacking of the components, wherein an inner layer and outer layer of said two-layered array have twelve cupriferous columns and eighteen cupriferous columns, respectively, and wherein at least some of the cupriferous columns of the inner layer are pentagonal in cross-section.

2. A component according to claim 1, wherein the cupriferous columns of the outermost layer are equisided, equi-angled hexagons in cross-section.

3. A component according to claim 2, wherein at least some of the cupriferous columns of the inner layer are identical to those of the outermost layer.

4. A component according to any preceding claim, wherein the central pillar is duodecagonal in cross-section.

5. A component according to claim 1 further surrounded by removable ductile filler strips so profiled as to impart to said component a void-free extrudable cross-section.

6. A component according to claim 5, wherein said extrudable cross-section is one of an equi-sided, equi-angled hexagon and a circle.

7. An intermediate member comprising a close-packed assembly of components according to claim 1.

* * * * *